(12) United States Patent
von Essen et al.

(10) Patent No.: US 7,997,684 B2
(45) Date of Patent: Aug. 16, 2011

(54) FLEXIBLE PRINTHEAD CIRCUIT

(75) Inventors: Kevin von Essen, San Jose, CA (US); Antai Xu, Cupertino, CA (US); Andreas Bibl, Los Altos, CA (US); John A. Higginson, Santa Clara, CA (US)

(73) Assignee: FUJIFILM Dimatix, Inc., Lebanon, NH (US)

( * ) Notice: Subject to any disclaimer, the term of this patent is extended or adjusted under 35 U.S.C. 154(b) by 336 days.

(21) Appl. No.: 12/271,707

(22) Filed: Nov. 14, 2008

(65) Prior Publication Data

US 2009/0066758 A1 Mar. 12, 2009

Related U.S. Application Data

(62) Division of application No. 11/119,308, filed on Apr. 28, 2005, now Pat. No. 7,452,057.

(60) Provisional application No. 60/567,925, filed on May 3, 2004.

(51) Int. Cl.
*B41J 2/14* (2006.01)
*B41J 2/05* (2006.01)

(52) U.S. Cl. .......................... 347/50; 347/58

(58) Field of Classification Search .................. 347/50, 347/58
See application file for complete search history.

(56) References Cited

U.S. PATENT DOCUMENTS

| | | | |
|---|---|---|---|
| 4,940,998 A | 7/1990 | Asakawa | |
| 5,016,023 A | 5/1991 | Chan et al. | |
| 5,096,316 A | 3/1992 | Otsuka et al. | |
| 5,265,315 A | 11/1993 | Hoisington et al. | |
| 5,424,767 A | 6/1995 | Alavizadeh et al. | |
| 5,635,964 A | 6/1997 | Burr et al. | |
| 5,889,539 A | 3/1999 | Kamoi et al. | |
| 6,019,457 A | 2/2000 | Silverbrook | |
| 6,454,394 B2 | 9/2002 | Shibano et al. | |
| 6,565,187 B2 * | 5/2003 | Karita et al. | 347/29 |
| 6,655,786 B1 | 12/2003 | Foote et al. | |
| 6,672,706 B2 | 1/2004 | Silverbrook | |
| 6,672,707 B2 | 1/2004 | Silverbrook | |
| 6,752,493 B2 | 6/2004 | Dowell et al. | |
| 7,448,741 B2 | 11/2008 | von Essen | |

(Continued)

FOREIGN PATENT DOCUMENTS

EP 0 847 862 6/1998
(Continued)

OTHER PUBLICATIONS

Examination Report dated Dec. 5, 2008 (and its translation) from Chinese Application No. 200580022629.5, 6 pages.

(Continued)

*Primary Examiner* — Geoffrey Mruk
(74) *Attorney, Agent, or Firm* — Fish & Richardson P.C.

(57) ABSTRACT

A flexible circuit for use within a printhead assembly and to connect a printhead body to an external circuit includes a substantially planar portion having one or more layers of conductive material and having a top surface substantially parallel to a top surface of the printhead body. One or more integrated circuits can be mounted onto the planar portion. Multiple leads extend from each integrated circuit, the leads electrically connected to the printhead body. One or more arms are attached to, and substantially perpendicular to, the planar portion, each arm including one or more external connectors configured to connect to the external circuit.

25 Claims, 18 Drawing Sheets

U.S. PATENT DOCUMENTS

| | | |
|---|---|---|
| 7,452,057 B2 | 11/2008 | Essen et al. |
| 2002/0003557 A1* | 1/2002 | Miyakoshi et al. ............. 347/58 |
| 2002/0060715 A1 | 5/2002 | Karita et al. |
| 2005/0190232 A1 | 9/2005 | Lee et al. |

FOREIGN PATENT DOCUMENTS

| | | |
|---|---|---|
| EP | 1 336 489 | 8/2003 |
| EP | 1 393 907 | 3/2004 |
| EP | 1 413 438 | 4/2004 |
| EP | 1 652 673 | 5/2006 |
| JP | 02-137967 | 5/1990 |
| JP | 09-123499 | 5/1997 |
| JP | 10-284196 | 10/1998 |
| JP | 11-157066 | 6/1999 |
| JP | 2003-341060 | 12/2003 |
| JP | 2005081597 | 3/2005 |

OTHER PUBLICATIONS

Examination Report dated Dec. 12, 2008 from European Application No. 05 744 111.5, 5 pages.

International Preliminary Report on Patentability for PCT Application No. PCT/US2005/014955, mailed Nov. 16, 2006, 7 pages.

International Search Report and Written Opinion for PCT Application No. PCT/US2005/014955, mailed Sep. 14, 2005, 11 pages.

Office action dated Jul. 14, 2010 received in co-pending Japanese Application No. 2007-511452, 4 pgs.

International Preliminary Report on Patentability for PCT Application No. PCT/US2007/068791, mailed Nov. 27, 2008, 6 pages.

International Search Report and Written Opinion of the International Searching Authority, PCT Application Serial No. PCT/US07/68791, Jan. 4, 2008, 9 pp.

JP Office Action (with English translation) dated Nov. 18, 2010 received in co-pending Japanese Application No. 2007-511452, 3 pgs.

CN Office action (with English translation) dated May 18, 2010 received in Chinese Application No. 200780026438.5, 6 pgs.

CN Office Action (with English Translation) dated Dec. 5, 2008 received in Chinese Application No. 200580022629.5, 6 pgs.

EP Office Action dated Jun. 11, 2007 received in European Application No. 05 744 111.5-2304, 5 pgs.

EP Office Action dated Dec. 12, 2008 received in European Application No. 05 744 111.5-2304, 5 pgs.

Supplementary European Search Report, dated Jan. 29, 2010, corresponding to European Application No. EP 07783671.6, 6 pages.

* cited by examiner

| Layer/Material | Distal Portions (microns) | Central Portion (microns) |
|---|---|---|
| 160/Copper | 17 | 17 |
| 161/Kapton | 25 | 25 |
| 162/Copper |  | 17 |
| 163/Adhesive |  | 25 |
| 164/Copper |  | 17 |
| 165/Kapton |  | 25 |
| 166/Copper |  | 17 |
| Total | 42 | 143 |
| Total with solder masks | 42 | 193 |

FLEXIBLE PRINTHEAD CIRCUIT

CROSS REFERENCE TO RELATED APPLICATIONS

This application is a divisional of and claims priority to U.S. Application Ser. No. 11/119,308, entitled "Flexible Printhead Circuit", filed on Apr. 28, 2005, (issued as U.S. Pat. No. 7,452,057 on Nov. 18, 2008) which claims priority to U.S. Provisional Application Ser. No. 60/567,925, entitled "Flexible Printhead Circuit", filed on May 3, 2004. The application herein claims the benefit of priority of all of the above listed patent applications and hereby incorporates by reference in their entirety the said patent applications.

BACKGROUND

The following description relates to a flexible circuit in a printhead assembly.

An ink jet printer typically includes an ink path from an ink supply to an ink nozzle assembly that includes nozzle openings from which ink drops are ejected. Ink drop ejection can be controlled by pressurizing ink in the ink path with an actuator, which may be, for example, a piezoelectric deflector, a thermal bubble jet generator, or an electrostatically deflected element. A typical printhead has a line of nozzle openings with a corresponding array of ink paths and associated actuators, and drop ejection from each nozzle opening can be independently controlled. In a so-called "drop-on-demand" printhead, each actuator is fired to selectively eject a drop at a specific pixel location of an image, as the printhead and a printing media are moved relative to one another. In high performance printheads, the nozzle openings typically have a diameter of 50 microns or less (e.g., 25 microns), are separated at a pitch of 100-300 nozzles per inch and provide drop sizes of approximately 1 to 70 picoliters (pl) or less. Drop ejection frequency is typically 10 kHz or more.

A printhead can include a semiconductor printhead body and a piezoelectric actuator, for example, the printhead described in Hoisington et al., U.S. Pat. No. 5,265,315. The printhead body can be made of silicon, which is etched to define ink chambers. Nozzle openings can be defined by a separate nozzle plate that is attached to the silicon body. The piezoelectric actuator can have a layer of piezoelectric material that changes geometry, or bends, in response to an applied voltage. The bending of the piezoelectric layer pressurizes ink in a pumping chamber located along the ink path.

Printing accuracy can be influenced by a number of factors, including the uniformity in size and velocity of ink drops ejected by the nozzles in the printhead and among the multiple printheads in a printer. The drop size and drop velocity uniformity are in turn influenced by factors, such as the dimensional uniformity of the ink paths, acoustic interference effects, contamination in the ink flow paths, and the uniformity of the pressure pulse generated by the actuators. Contamination or debris in the ink flow can be reduced with the use of one or more filters in the ink flow path.

SUMMARY

A flexible circuit for use in a printhead assembly is described. In general, in one aspect, the invention features a circuit to connect a printhead body to an external circuit. The circuit includes a substantially planar portion, one or more integrated circuits, a plurality of leads and one or more arms. The substantially planar portion includes one or more layers of conductive material and has a top surface substantially parallel to a top surface of the printhead body. The one or more integrated circuits are mounted onto the planar portion. The plurality of leads extends from each integrated circuit and are electrically connected to the printhead body. The one or more arms are attached to, and substantially perpendicular to, the planar portion, each arm including one or more external connectors configured to connect to the external circuit.

Implementations can include one or more of the following features. The circuit can further include a plurality of apertures, each aperture coated with a conductive material and providing an electrical connection to the printhead body. Each of the plurality of leads can extend from an integrated circuit to connect to one of the plurality of apertures.

The planar portion can include at least one layer of copper and at least one layer of polyimide. The planar portion can further include a central portion having of a first layer of polyimide coated on either side with layers of copper, a second layer of polyimide coated on either side with layers of copper, and a layer of adhesive joining the first layer to the second layer, and two distal portions on either side of the central portion, each distal portion having of a layer of polyimide coated with a layer of copper. The two distal portions can be attached to the top surface of the printhead body and the central portion can be raised from the top surface of the printhead body relative to the two distal portions. The leads can include traces of copper affixed to a top surface of the circuit, the top surface formed from polyimide. Each arm can include a distal end that is substantially parallel to the top surface of the planar portion, the distal end including one or more contacts to connect to the external circuit.

The substantially planar portion of the circuit can further include a central portion and two distal portions on either side of the central portion, where the two distal portions are attached to the top surface of the printhead body and the central portion is raised from the top surface of the printhead body relative to the two distal portions. The central portion can include a plurality of layers including at least one conductive layer, and the distal portions can include a plurality of layers, including at least one conductive layer, where the number of layers included in the central portion and the distal portions are not equal.

In general, in another aspect, the invention features a system to connect a printhead body to an external circuit. The system includes a circuit and an interposer. The circuit is configured to connect to the interposer. The circuit includes a substantially planar portion, one or more integrated circuits, a plurality of leads and one or more arms. The substantially planar portion includes one or more layers of conductive material and has a top surface substantially parallel to a top surface of the printhead body. The one or more integrated circuits are mounted onto the planar portion. The plurality of leads extend from each integrated circuit and are electrically connected to the printhead body. The one or more arms are attached to, and substantially perpendicular to, the planar portion, each arm including one or more external connectors configured to connect to the external circuit.

The interposer includes an upper surface configured to connect to the circuit, a lower surface configured to connect to the printhead body, and a plurality of interposer apertures, each interposer aperture coated with a conductive material and providing an electrical connection to the printhead body. Each of the plurality of interposer apertures is in electrical communication with a corresponding one of the plurality of leads.

Implementations of the invention can include one or more of the following features. The interposer can include a heating element. The circuit can further include a plurality of circuit apertures, each circuit aperture coated with a conductive material and providing an electrical connection to a corresponding interposer aperture. Each of the plurality of leads can extend from an integrated circuit to connect to one of the plurality of circuit apertures, such that each of the plurality of leads is in electrical communication with a corresponding one of the plurality of interposer apertures. The interposer can include one or more recesses formed in the upper surface, the one or more recesses configured to receive the one or more integrated circuits mounted on the planar portion of the circuit. Each of the plurality of leads can extend from an integrated circuit to connect to one of the plurality of interposer apertures, such that each of the plurality of leads is in electrical communication with a corresponding one of the plurality of interposer apertures.

The planar portion of the circuit can include at least one layer of copper and at least one layer of polyimide. Each arm can include a distal end that is substantially parallel to the top surface of the planar portion, the distal end including one or more contacts to connect to the external circuit. The planar portion of the circuit can further include a first layer of polyimide coated on either side with layers of copper, a second layer of polyimide coated on either side with layers of copper, and a layer of adhesive joining the first layer to the second layer.

In general, in another aspect, the invention features a system to connect a printhead body to an external circuit. The system includes a circuit configured to connect to an interposer and an interposer. The circuit includes a substantially planar portion including one or more layers of conductive material and having a top surface substantially parallel to a top surface of the printhead body and one or more integrated circuits mounted onto a bottom surface of the planar portion. The circuit further includes a plurality of leads extending from each integrated circuit, the plurality of leads electrically connected to the printhead body by way of a plurality of interposer apertures. One or more arms are attached to, and substantially perpendicular to, the planar portion, each arm including one or more external connectors configured to connect to the external circuit.

The interposer includes an upper surface configured to connect to the circuit, the upper surface including one or more recesses configured to receive the one or more integrated circuits mounted on the bottom surface of the substantially planar portion of the circuit, and a lower surface configured to connect to the printhead body. A plurality of interposer apertures extend from the upper surface through to the lower surface. Each interposer aperture is coated with a conductive material and configured to provide an electrical connection between the circuit and the printhead body. Each of the plurality of interposer apertures is in electrical communication with a corresponding one of the plurality of leads of the circuit.

In one implementation, the interposer can further include a heating element.

The invention can be implemented to realize one or more of the following advantages. The leads from the integrated circuits mounted on the flexible circuit to the actuators, e.g., piezoelectric actuators, are short, permitting very high speed and dense signal lines near the printhead body. The short leads also have lower resistance and inductance, and can therefore allow higher frequency operation with less waveform distortion in the signals reaching the actuators. Shorter leads also radiate less noise.

Including an interposer between a flexible circuit and a printhead body can realize one or more of the following advantages. The flexible circuit can be connected to the interposer before attaching the interposer to the printhead body. This allows connections of the flexible circuit, and between the flexible circuit and the interposer, to be tested before the flexible circuit/interposer assembly is attached to the printhead body. If there is a problem with the connections, the flexible circuit can be replaced, without having to replace the printhead body, or without having to remove the flexible circuit from the printhead body which may damage the printhead body. The likelihood of damaging the printhead body during the assembly process is reduced by attaching the flexible circuit to the interposer rather than directly to the printhead body. The surfaces of the interposer and the printhead body that will be in contact with one another can be polished to provide a precise match. This can reduce or eliminate pressure variations along the length of the printhead body that can occur when attaching the circuit directly to the printhead body by soldering. Optionally, the interposer can include a heating element. The flexible circuit can be formed substantially flat, thereby also eliminating the need to shape the circuit, for example, to form bends.

An advantage of an embodiment of the flexible circuit that has the integrated circuits mounted on the same surface as the contact surface with an interposer, is the elimination of apertures to connect the leads to the interposer.

Details of one or more implementations are set forth in the accompanying drawings and the description below. Other features and advantages may be apparent from the description and drawings, and from the claims.

DRAWING DESCRIPTIONS

These and other aspects will now be described in detail with reference to the following drawings.

Like reference symbols in the various drawings indicate like elements.

DETAILED DESCRIPTION

Figure 1:
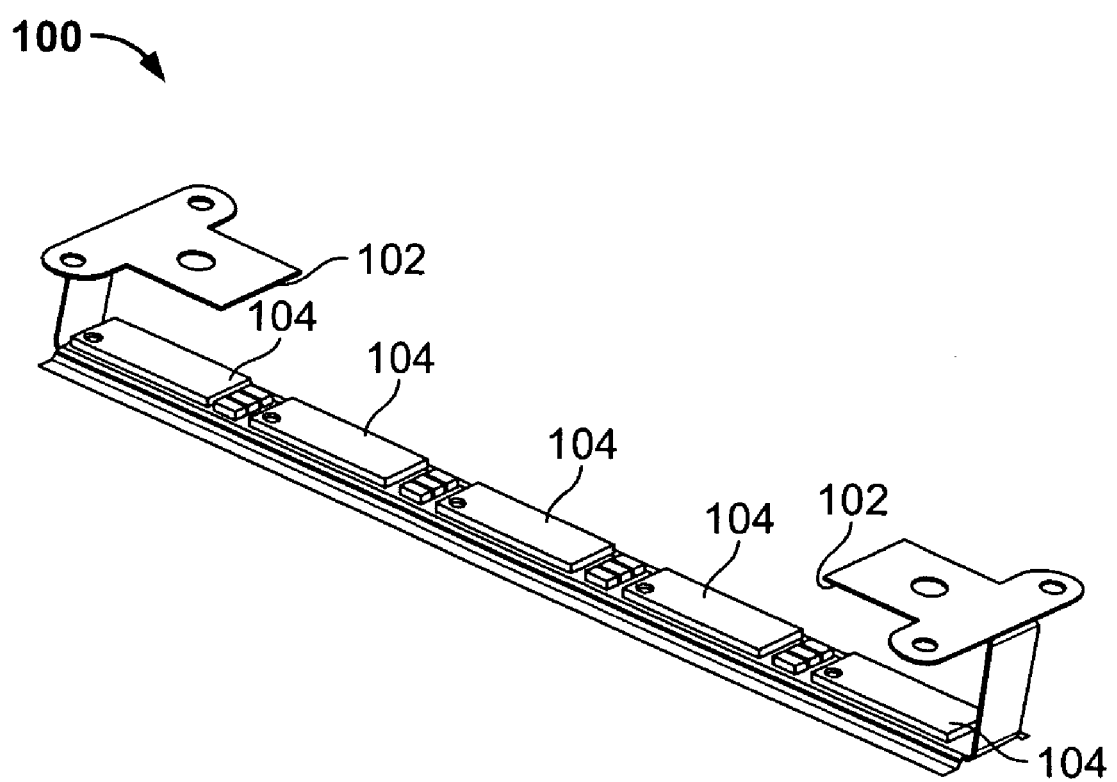
FIG. 1 shows a flexible circuit.

Referring to FIG. 1, one embodiment of a flexible circuit 100 for providing signals for controlling ink drop ejection in a printhead is shown. The flexible circuit 100 includes external connectors 102 to connect the flexible circuit 100 to a second circuit (not illustrated in FIG. 1) for connecting to a source of the signals, such as a processor located within a printer. Integrated circuits, dies or chips 104 are mounted on the flexible circuit 100 to receive input signals from the external connectors and to generate output drive signals. The output drive signals are transmitted to a printhead body to selectively eject ink drops from specific nozzles, for example, by selectively firing corresponding actuators in a printhead including a piezoelectric deflector for pressurizing ink in an ink path. The integrated circuits 104 can be connected to multiple leads on the flexible circuit 100. Some of these leads can extend to the external connectors 102 to carry the input signals. Other leads can extend from the integrated circuits to corresponding conductive apertures formed within the flexible circuit 100 to carry the output drive signals to a device, e.g., a printhead body, upon which the flexible circuit 100 is mounted.

Before describing the flexible circuit 100 in further detail, an example of a printhead assembly in which the flexible circuit 100 can be used shall be described to provide a context for the description of the flexible circuit 100. The printhead assembly described is exemplary and for illustrative purposes only. The flexible circuit 100 can be adapted to be used within other printhead assemblies not described herein.

Figure 2A:
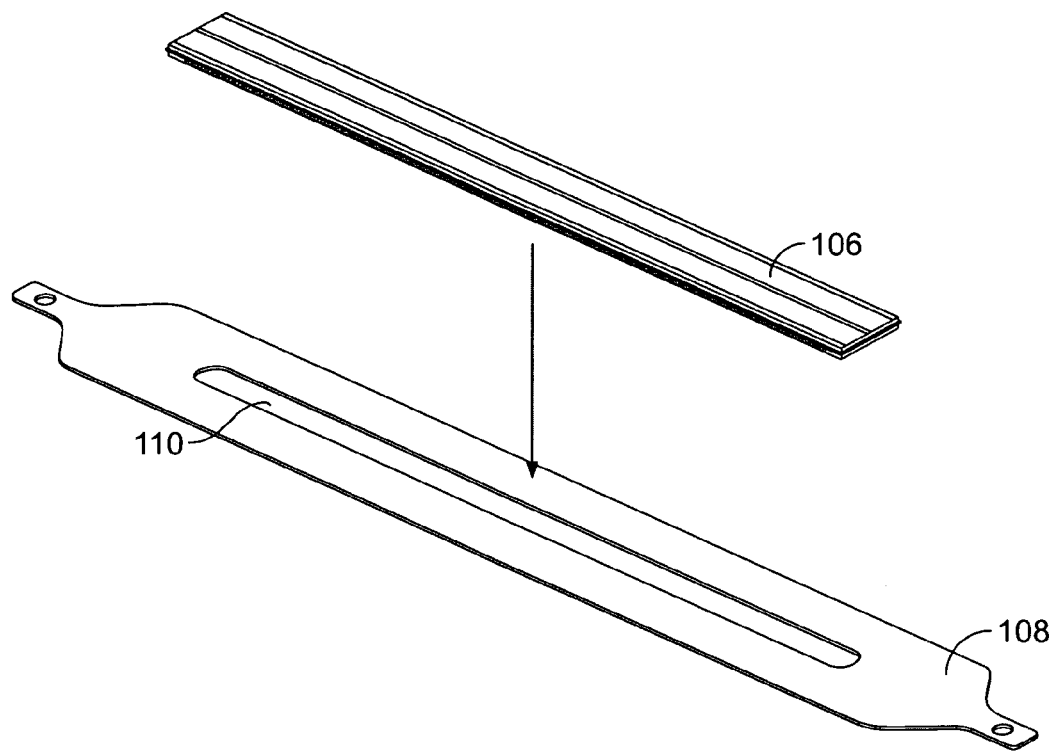
FIGS. 2A and 2B show a printhead body and a faceplate.
Figure 2B:
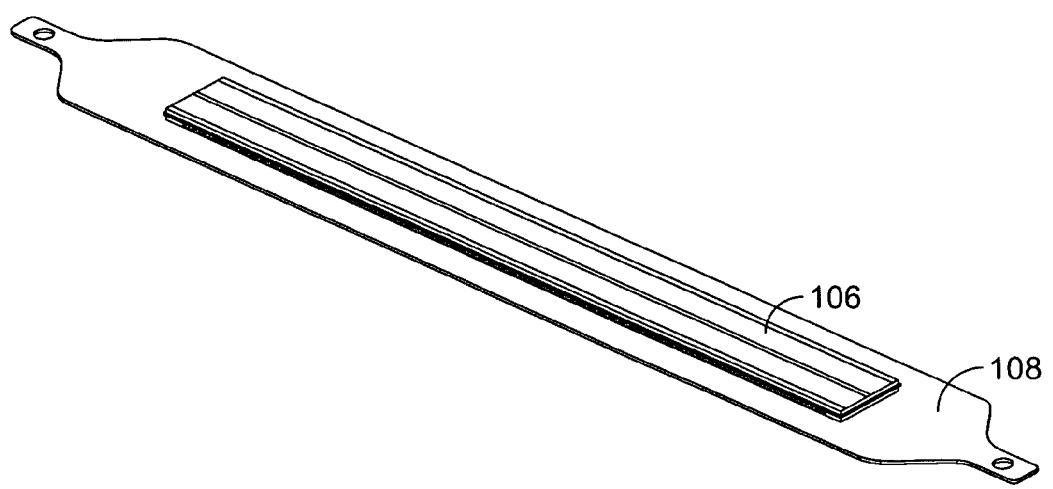

Referring to FIGS. 2A and 2B, a printhead body 106 and a faceplate 108 are shown. The printhead body 106 can be, for example, a MEMS silicon die, such as the printhead described in Hoisington, et al., U.S. Pat. No. 5,265,315, or the semiconductor printhead unit described in U.S. Provisional Application Ser. No. 60/510,459, entitled "Print Head with Thin Membrane", filed Oct. 10, 2003, the disclosures of which are hereby incorporated by reference. The printhead body 106 can be etched to define ink chambers and an array of ink nozzles to eject ink drops, and can include piezoelectric actuators corresponding to each of the ink nozzles. Each piezoelectric actuator can have a layer of piezoelectric material that changes geometry, or bends, in response to an applied voltage. The bending of the piezoelectric layer pressurizes ink in a chamber located along the ink path. The surface of the printhead body 106 bearing the ink nozzles is positioned on and affixed to the faceplate 108, for example, using an epoxy. However, the faceplate 108 can include an opening 110 positioned to expose the ink nozzles.

Figure 3A:
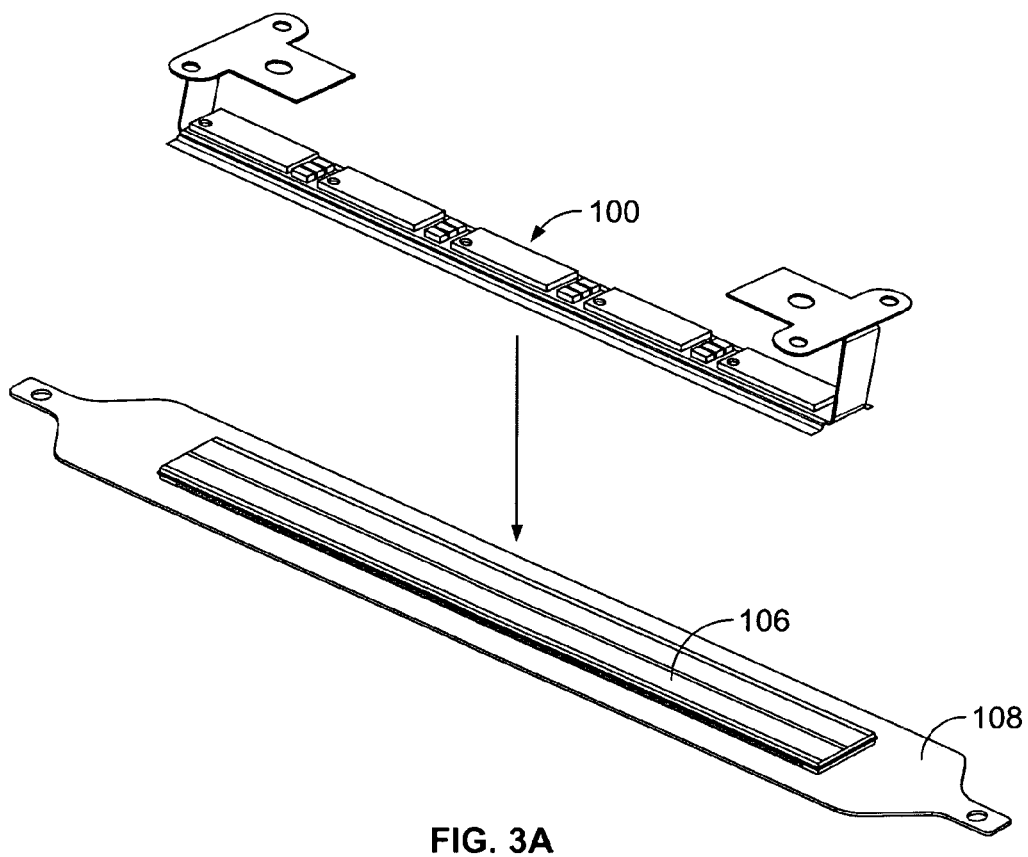
FIG. 3A shows an exploded view of a flexible circuit and the assembly shown in FIG. 2B.
Figure 3B:
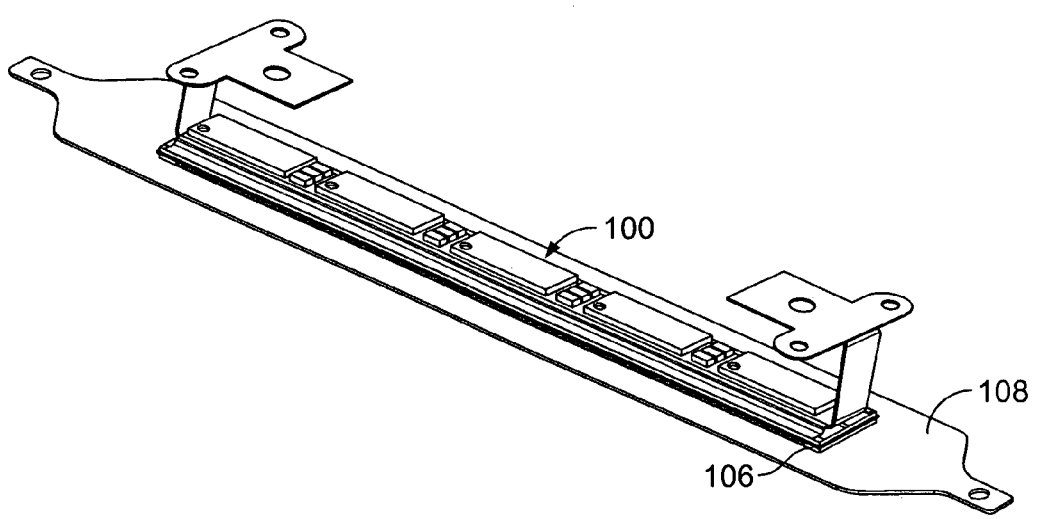
FIG. 3B shows the flexible circuit mounted on the assembly shown in FIG. 2B.

Referring to FIGS. 3A and 3B, in one embodiment, the flexible circuit 100 is configured to fit on top of the printhead body 106. The flexible circuit 100 is affixed to the printhead body 106, for example, by soldering of electrical connectors.

Figure 4A:
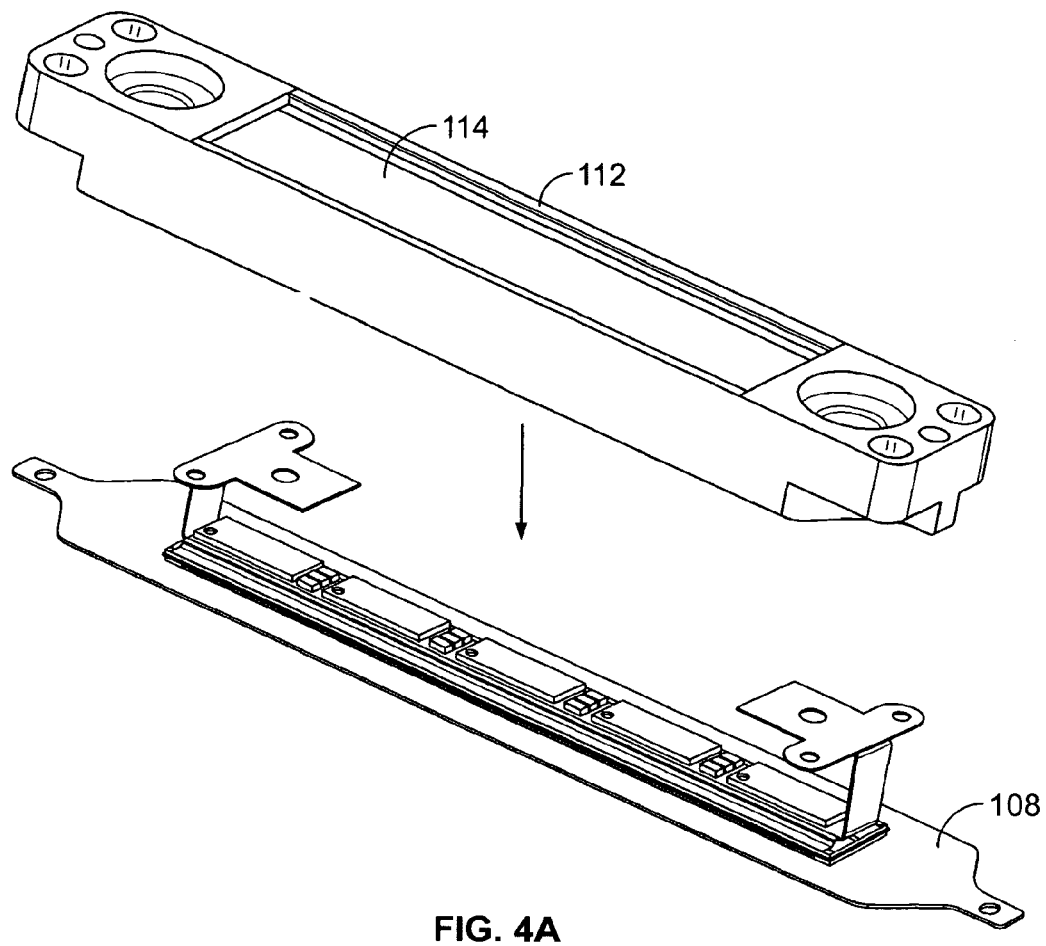
FIG. 4A shows an exploded view of a printhead housing and the assembly shown in FIG. 3B.
Figure 4B:
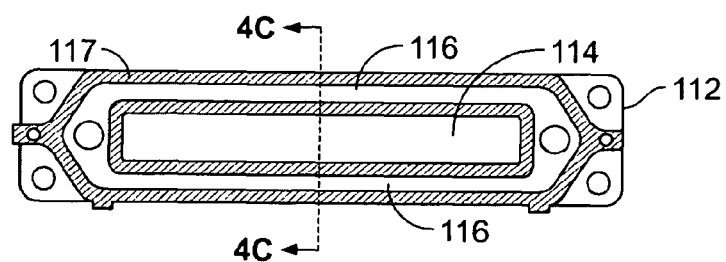
FIG. 4B shows a bottom view of the printhead housing of FIG. 4A.
Figure 4C:
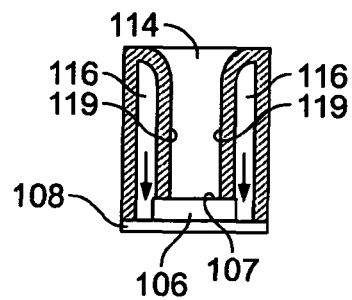
FIG. 4C shows a cross-sectional view of the printhead housing of FIG. 4B taken along line 4C-4C.
Figure 4D:
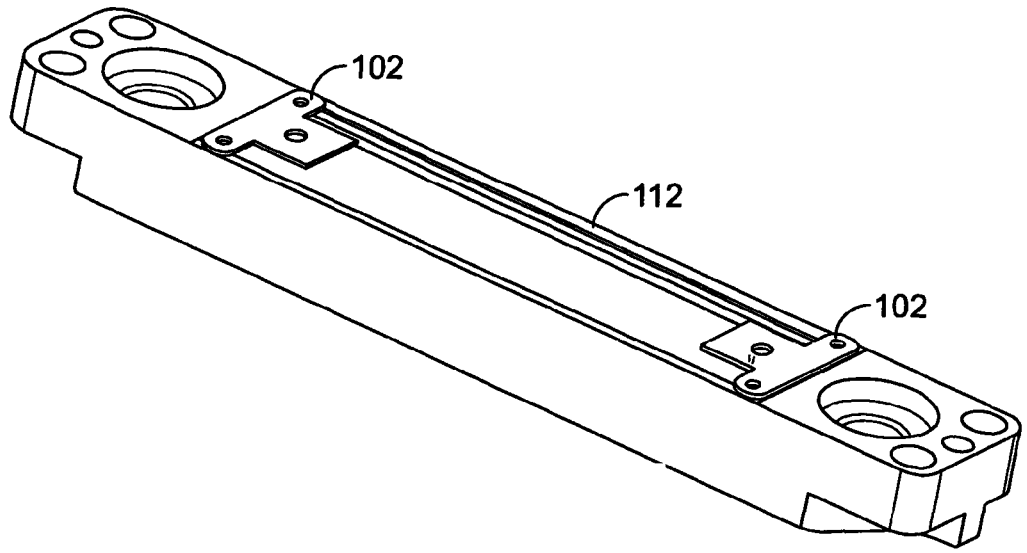
FIGS. 4D and 4E show the printhead housing mounted on the faceplate and housing the printhead body and flexible circuit of FIG. 3B.
Figure 4E:
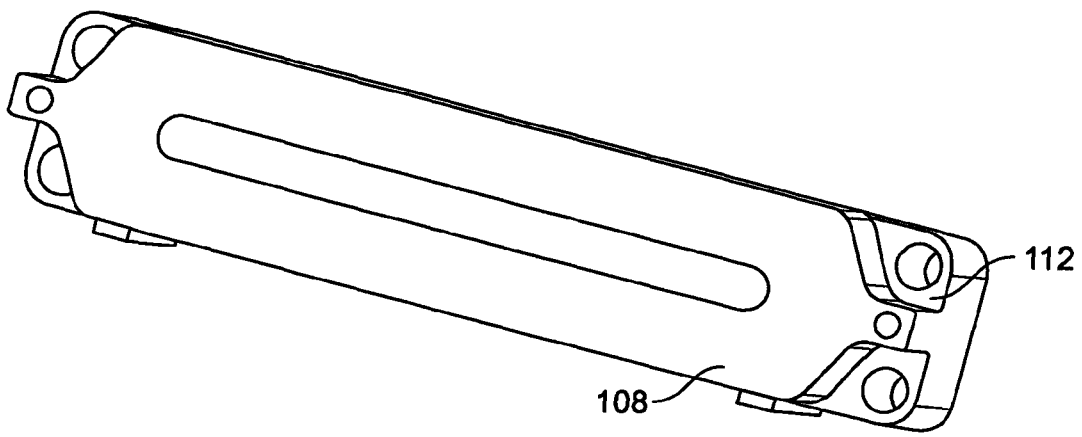

Referring to FIG. 4A, a printhead housing 112 can be positioned on the faceplate 108, extending around and over the printhead body 106 and flexible circuit 100. The printhead housing 112 can be affixed to the faceplate 108 using, for example, an epoxy. Referring to FIG. 4B, in the exemplary printhead shown, the printhead housing 112 is a molded, plastic housing including a central opening 114 to receive and house the printhead body 106, and including channels 116 formed in a lower surface 117. FIG. 4C shows a cross-sectional view of the printhead housing 112 mounted to the printhead body 106, taken along line 4C-4C of FIG. 4B. When the lower surface 117 of the printhead housing 112 is affixed to the faceplate 108, the inner walls 119 of the channels 116 contact the top surface 107 of the printhead body 106. The channels 116 thereby form an ink path directed toward ink nozzles included in the printhead body 106. The printhead housing 112 is described further in U.S. patent application Ser. No. 10/836,456, entitled "Elongated Filter Assembly" of Kevin Von Essen, filed Apr. 30, 2004, the entire contents of which are incorporated herein by reference. FIGS. 4D and 4E show the printhead housing 112 affixed to the face place 108, with the flexible circuit 100 housed within the central opening 114.

Figure 5A:
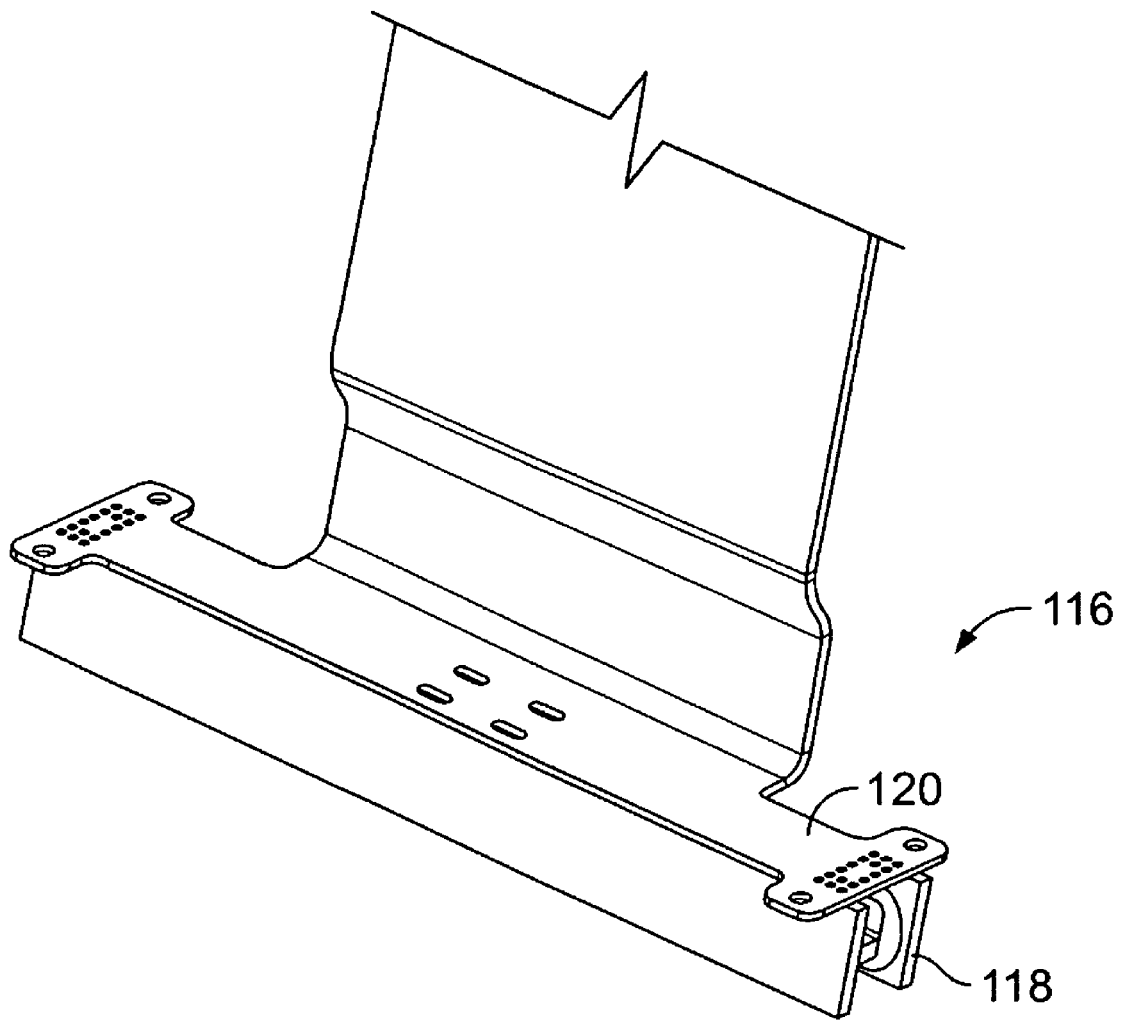
FIG. 5A shows a heater assembly.
Figure 5B:
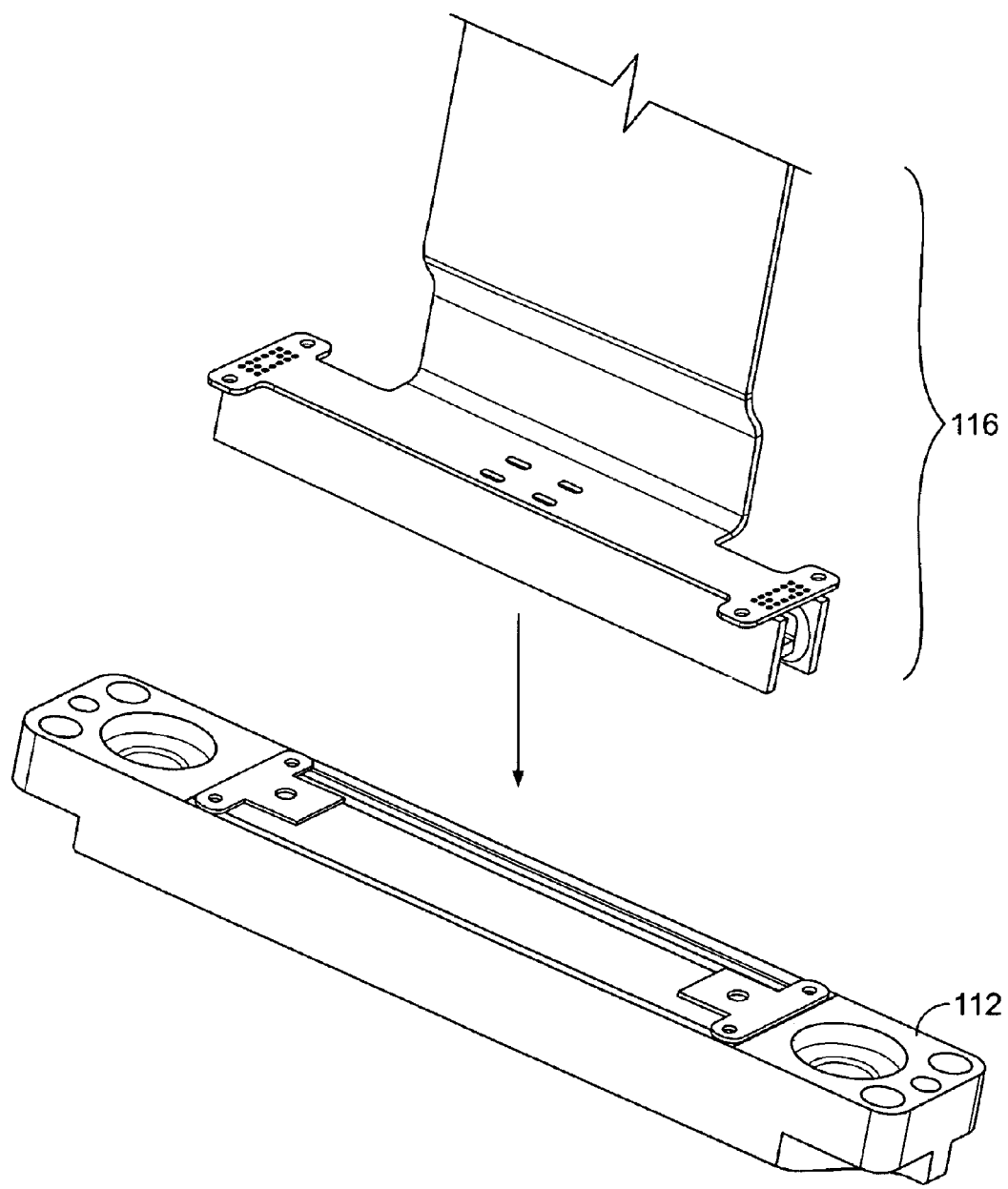
FIG. 5B shows an exploded view of the heater assembly of FIG. 5A and the printhead assembly of FIGS. 4D and 4E.
Figure 5C:
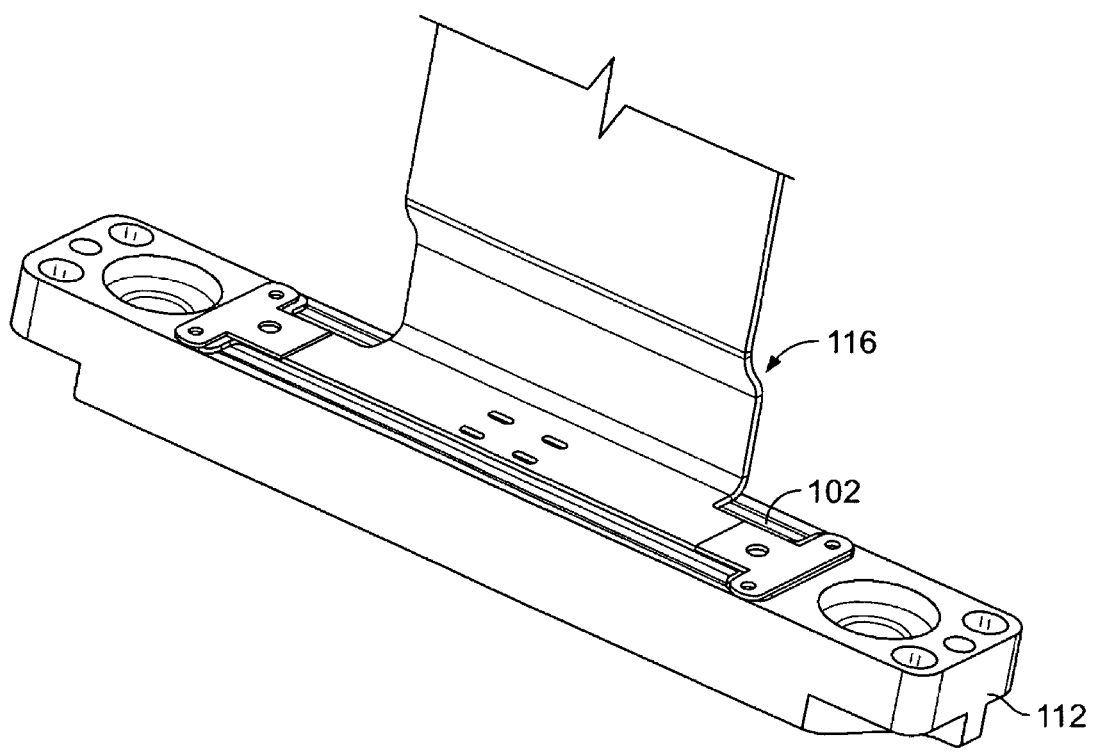
FIG. 5C shows the heater assembly of FIG. 5A positioned within the printhead assembly of FIGS. 4D and 4E.

Referring to FIGS. 5A-C, a heater assembly 116 including a heater unit 118 and external circuit 120 is shown. The external circuit 120 can connect to a processor located within the printer for controlling ink drop ejection from the ink nozzles. The heater assembly 116 fits within the central opening 114 formed in the printhead housing 112, and the external connectors 102 of the flexible circuit 100 fold over the top of the heater assembly 116 to contact and provide an electrical connection between the flexible circuit 100 and the external circuit 120, which is described further below.

Figure 6A:
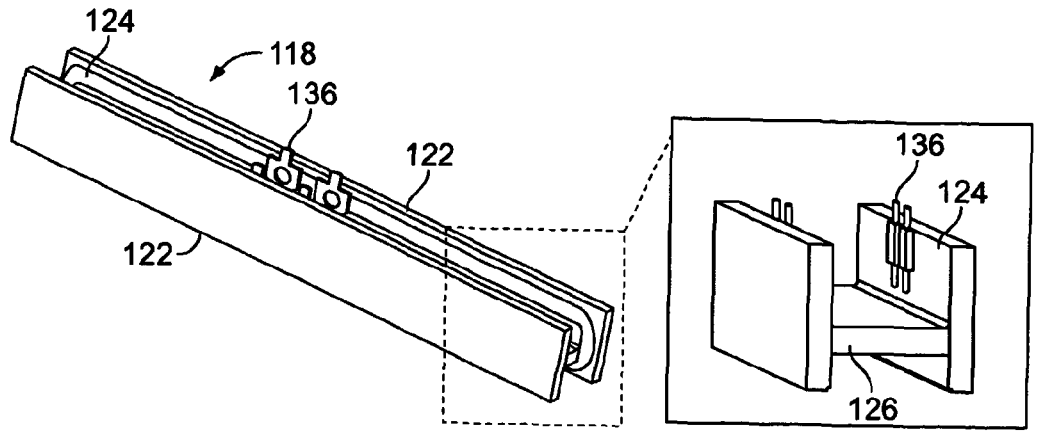
FIG. 6A shows a heater unit.
Figure 6B:
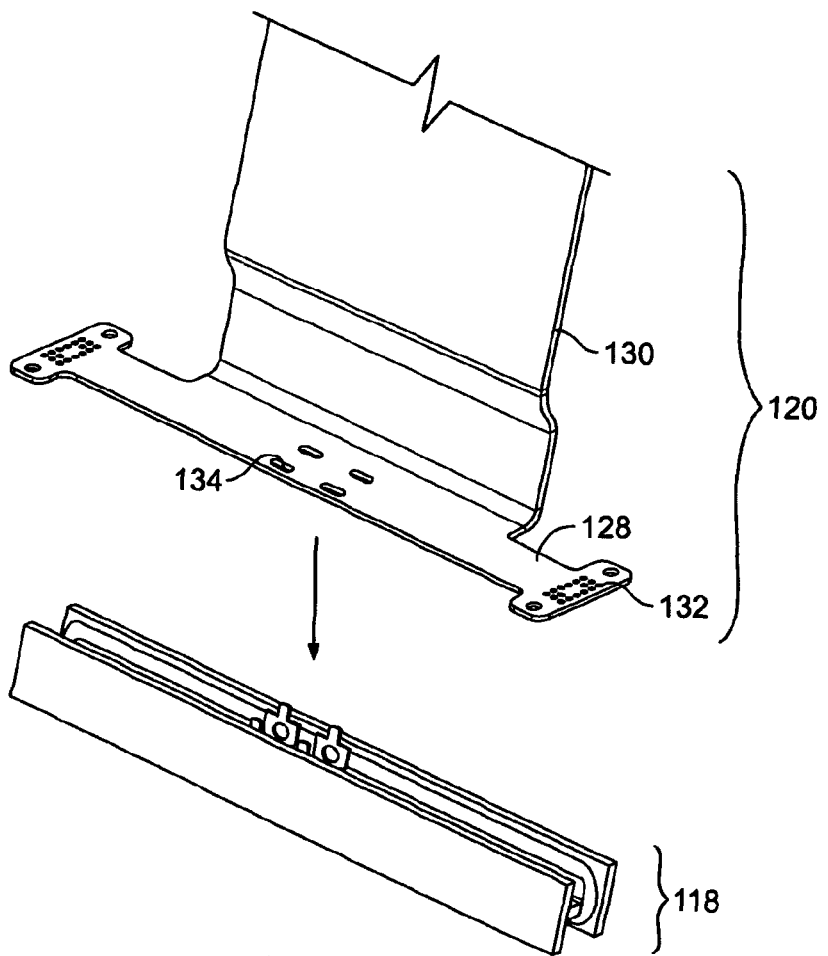
FIG. 6B shows an exploded view of an external circuit and a heater unit.

Referring to FIGS. 6A and 6B, the heater unit 118 can include two vertical panels 122 including heating elements 124 and a horizontal spacer 126. The vertical panels 122 and horizontal spacer 126 can be formed from a material, such as silicon. The external circuit 120 includes a connection plate 128 and a flexible cable 130. The connection plate 128 includes contacts 132 to electrically connect to the external connectors 102 of the flexible circuit 100. The connection plate 128 also includes openings 134 that can provide an electrical connection to heater connectors 136 extending upwardly from the vertical panels 122 of the heater unit 118. Electrically connecting the heater unit 118 to the connection plate 128, and therefore the flexible cable 130, allows the temperature of the heater unit 118 to be controlled by the processor connected to the external circuit 120.

Figure 7A:
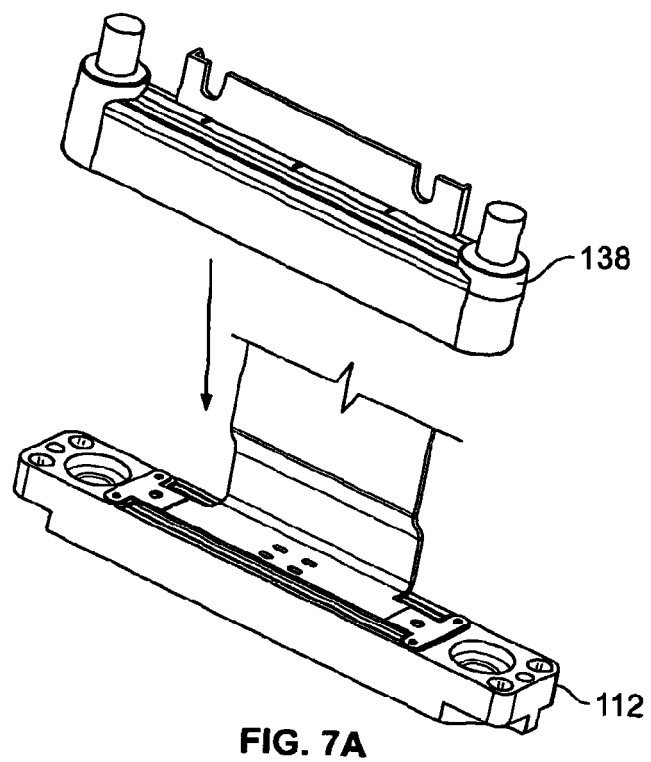
FIG. 7A shows an exploded view of a filter assembly and the printhead assembly of FIG. 5C.
Figure 7B:
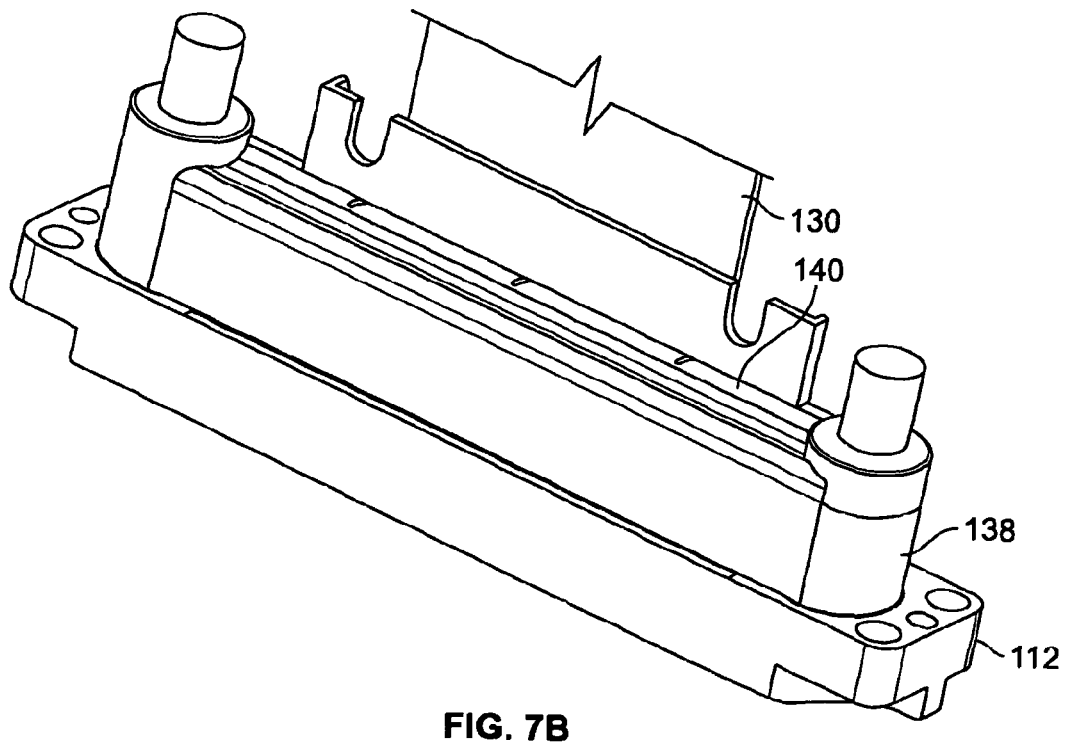
FIG. 7B shows the filter assembly mounted on the printhead assembly of FIG. 5C.

Referring to FIGS. 7A and 7B, a filter assembly 138, such as the filter assembly described in U.S. patent application Ser. No. 10/836,456, referred to above, can be positioned on top of the printhead housing. The filter assembly 138 includes one or more filters through which the ink must pass before entering the printhead housing and then the ink nozzles. A guide 140 can be included on the filter assembly 138 to guide the position of the flexible cable 130.

Figure 8A:
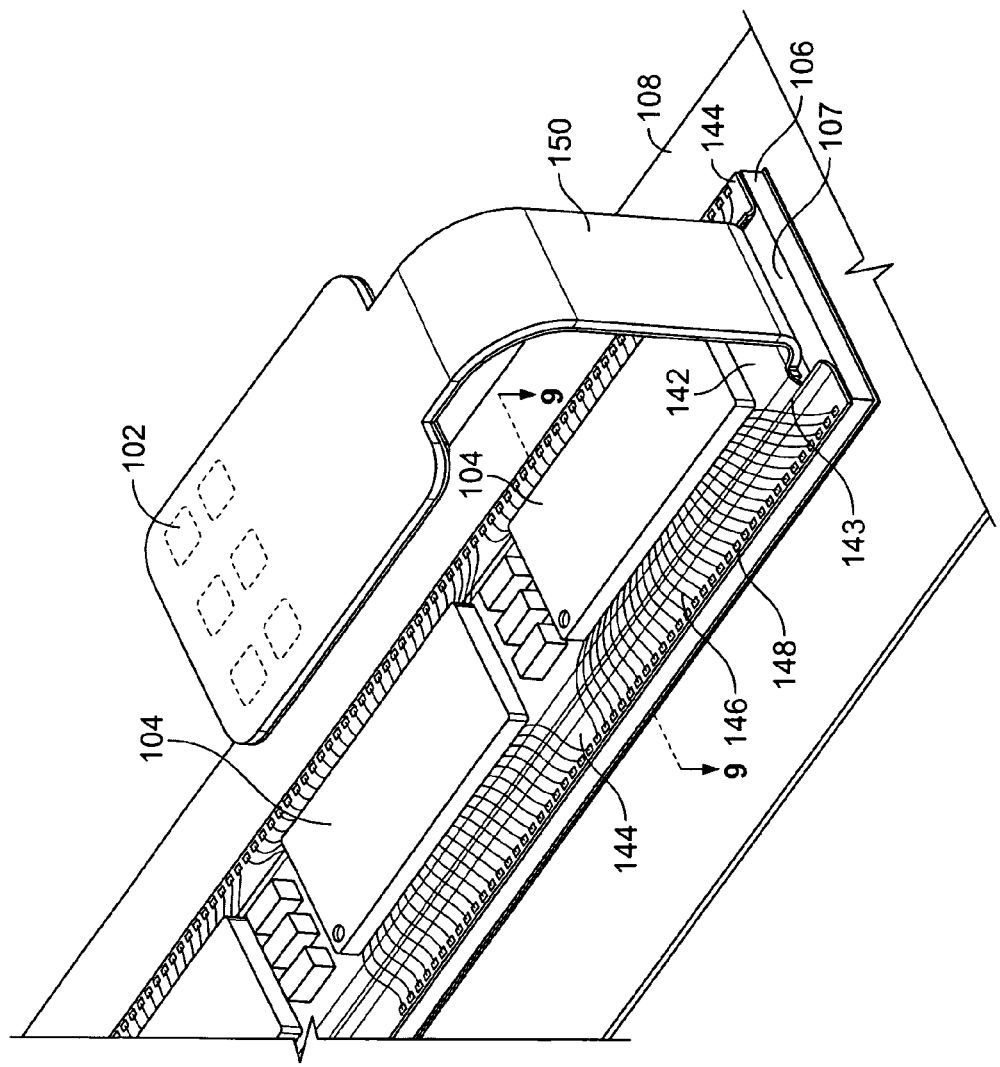
FIG. 8A shows a perspective view of a portion of the printhead assembly of FIG. 3B.

Having described one example of a printhead within which an embodiment of the flexible circuit 100 can be implemented, the flexible circuit 100 shall now be described in further detail. FIG. 8A shows an enlarged, partial view of one embodiment of the flexible circuit 100 mounted on a printhead body 106, which is mounted onto a faceplate 108. In this embodiment, the flexible circuit 100 is formed having a "gull-wing" structure. That is, the flexible circuit 100 includes a substantially planar central portion 142 that is positioned substantially parallel to the top surface 107 of the printhead body 106. The flexible circuit 100 further includes distal portions 144 extending the length of the flexible circuit 100 and also substantially parallel to the top surface 107 of the printhead body 106. The central portion 142 and distal portions 144 are joined by bent portions 143 that extend at an angle between the central and distal portions 142, 144.

The central portion 142 is raised to accommodate the topography of the top surface 107 of the printhead body 106 to which the flexible circuit 100 is mated. In particular, in an embodiment where the printhead body 106 includes piezoelectric actuators, space is provided between the flexible circuit 100 and the piezoelectric material on the upper surface of the printhead body 106 to allow the piezoelectric material room to flex.

Integrated circuits 104 are affixed to the upper surface of the central portion 142 of the flexible circuit 100. Flexible circuit leads 146 are shown extending from each integrated circuit 104 to corresponding apertures 148 formed in the distal portions 144 of the flexible circuit 100. A flexible circuit lead 146 is provided for each ink nozzle included in the printhead body 106. The flexible circuit lead 146 transmits a signal from the integrated circuit 104 to an activator that activates the ink nozzle. For example, in this embodiment, the flexible circuit lead 146 transmits an electrical signal to activate a piezoelectric actuator to fire an ink nozzle.

On either end of the flexible circuit 100 an arm 150 extends upwardly in a direction substantially perpendicular to the surface of the faceplate 108 upon which the printhead body 106 is mounted and folds over, such that the distal end of the arm 150 is substantially parallel to the surface of the faceplate 108. External connectors 102 (shown in phantom) are included on the underside of the distal end of the arm 150. As shown previously in FIGS. 5C and 6B, the external connectors 102 are configured to mate with connectors 132 on a connection plate 128 of an external circuit 120. In one embodiment, the external connectors 102 are ball pads that electrically connect to traces on the surface of the connection plate 120. In another embodiment, the external connectors are male or female electrical connectors.

Figure 8B:
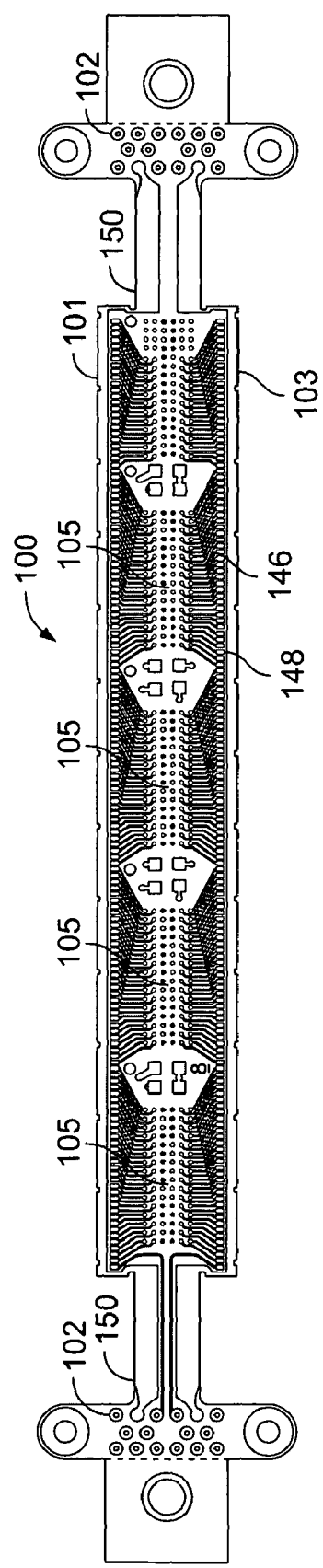
FIGS. 8B and 8C show schematic representations of the flexible circuit of FIG. 1 without integrated circuits mounted thereon.

FIG. 8B is a schematic representation of a top view of the flexible circuit 100 with the integrated circuits 104 removed and with the arms 150 spread flat, so as to be in the same plane as the balance of the flexible circuit 100. In the regions 105 where an integrated circuit 104 would typically be mounted, an array of contacts is shown. In this embodiment, each region 105 includes a 16×6 array of contacts 101. The two outermost rows of contacts on either side of each array are connected to flexible circuit leads 146. In one embodiment, the leads can be copper traces with a thin gold plating, to prevent oxidation. Each flexible circuit lead 146 connects to a corresponding aperture 148 formed in a distal portion 144 of the flexible circuit 100.

The integrated circuit 104 has integrated circuit (IC) leads formed on the surface that will contact the flexible circuit 100. The IC leads can be, for example, a 16×6 ball grid array has is configured to correspond to the 16×6 contact array formed on the flexible circuit 100. When the integrated circuit 104 is positioned on the flexible circuit 100, the ball grid array aligns with the contact array on the flexible circuit 100. The IC leads can be soldered to the contacts 101 in the contact array, thereby connecting the integrated circuit 104 to the flexible circuit 100, and forming an electrical connection between the IC leads and the contacts 101.

The flexible circuit leads 146 are connected to the contacts 101, which contacts 101 are connected to the IC leads. The flexible circuit leads 146 are also connected to the printhead body 106 by the conductive apertures 148. The top surface 107 of the printhead body 106 includes ground contacts positioned along the edges of the printhead body 106 and drive contacts positioned laterally inward of their associated ground contacts. The ground contacts of the printhead body 106 are connected (and thereby grounded) to a common ground 103 that is formed along the length of the distal portions of the flexible circuit 100. Each drive contact of the printhead body 106 is connected to a conductive aperture 148 of the flexible circuit 100. As such, output drive signals generated by the integrated circuits 104 are transmitted from the integrated circuits 104 to the drive contacts of the piezoelectric actuators in the printhead body 106 to apply a voltage to the actuators and thereby selectively drive the corresponding ink nozzles.

The contacts 101 in the two inner rows can be used to connect the integrated circuit 100 to connective layers within the flexible circuit 100. For example, an aperture can be formed in the flexible circuit 100 that extends to a connective layer, e.g., a copper layer, and the aperture filled or coated with a conductive material. An IC lead on the integrated circuit 100 touches the contact to form an electrical connection to the connective layer. The connective layer extends the length of the flexible circuit 100, including the arms 150, and is electrically connected to at least one of the electrical connectors 102 formed on the distal ends of the arms 150. As such, input signals from the external circuit 120 are transmitted from the external circuit 120 to the integrated circuits 104. Referring again to FIG. 8B, the arms 150 are extended flat, exposing the underside of each distal end. The external connectors 102 on the underside of each distal end of an arm are shown.

Figure 8C:
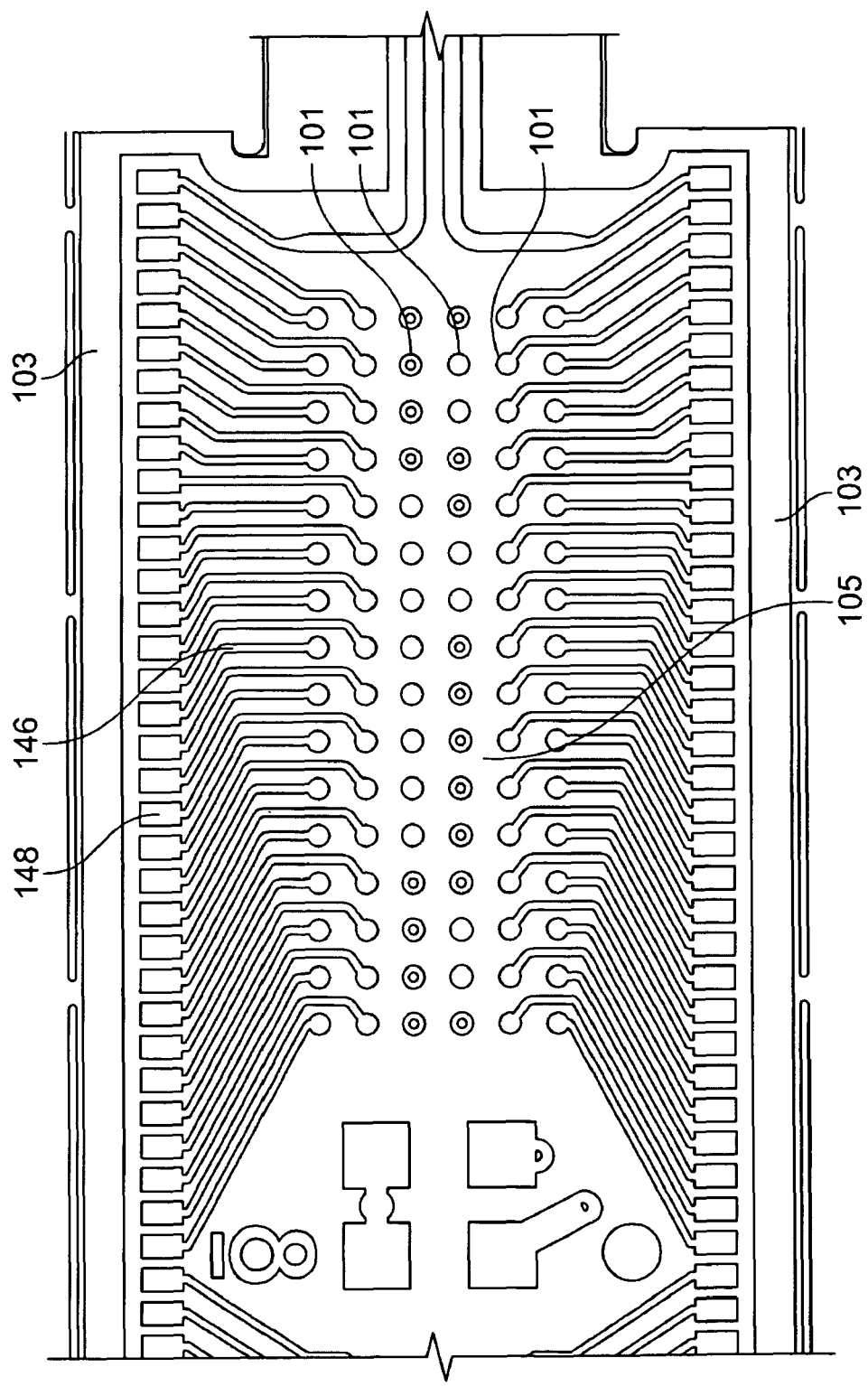

Referring to FIG. 8C, an enlarged view of one region 105 of the flexible circuit 100 is shown. In this embodiment, there are at least 64 flexible circuit leads 146 connected to each integrated circuit 104, which integrated circuit 104 drives 64 ink nozzles included in the printhead body 106.

Figure 9:
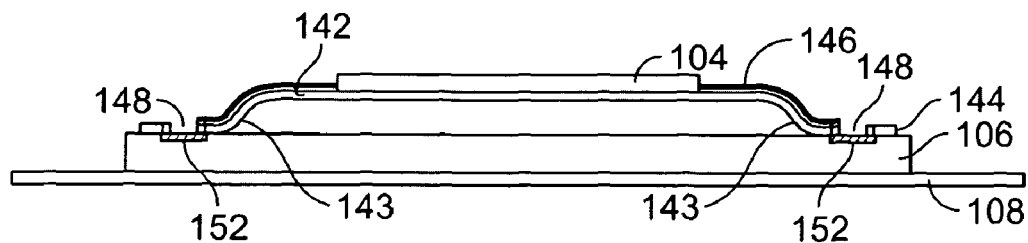
FIG. 9 shows a cross-sectional view of the printhead assembly of FIG. 8A taken along line 9-9.

FIG. 9 shows a cross-sectional view of the flexible circuit 100 taken along line 9-9 shown in FIG. 8A. The integrated circuit 104 is mounted on top of the central portion 142 of the flexible circuit 100. A flexible circuit lead 146 is shown extending from beneath the integrated circuit 104 toward a distal portion 144 of the flexible circuit 100. The flexible circuit lead 146 extends to a corresponding aperture 148 formed in the flexible circuit 100. The aperture 148 extends through the thickness of the circuit and is aligned to a drive contact 152 on the printhead body 106. For example, the drive contact 152 can be a trace on the top surface 107 of the printhead body 106. The flexible circuit lead 146 extends through the aperture 148. For example, the aperture 148 can be coated in a conductive material, such as gold or copper. An electrical signal passing from the integrated circuit 104 through the flexible circuit lead 146 travels through the conductive material to the drive contact 152, thereby establishing a connection between the integrated circuit 104 and the printhead body 106, for example, to apply a voltage to a piezoelectric actuator.

Figure 10A:
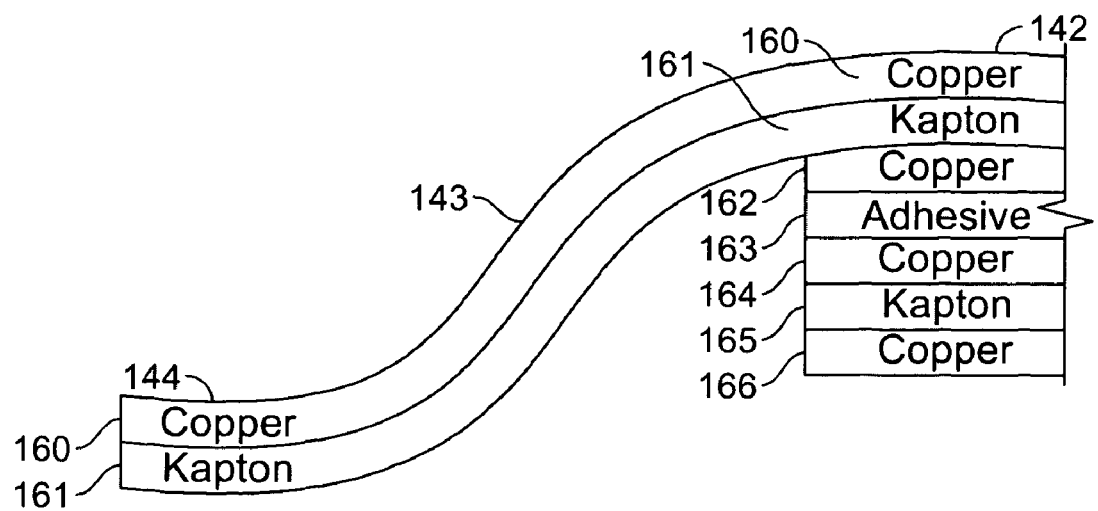
FIG. 10A shows an enlarged cross-sectional view of a portion of a flexible circuit.

FIG. 10A shows an enlarged cross-section view of a portion of the flexible circuit 100. In the embodiment shown, the central portion 142 of the flexible circuit 100 is formed from a different number of layers as compared to the distal portions 144. The distal portions 144 are formed from layers 160 and 161, where layer 160 can be a conductive layer such as a copper layer, and layer 161 can be an insulator layer such as a polyimide layer, e.g., Kapton® available from DuPont High Performance Materials of Ohio. The central portion 142 includes additional layers 162-166 of copper; adhesive; copper; Kapton; and copper, respectively. That is, the central portion 142 includes four layers of copper, where each copper layer is separated by a layer of Kapton or adhesive. The central portion 142 can be formed as two Kapton layers 161, 165 coated on either side with copper and then joined by an adhesive 163. In the central portion 142 where the integrated circuits 104 are attached to the flexible circuit 100, the additional layers provide interconnects (the copper layers), e.g., to connect the integrated circuits 104 to the external connectors 102, and support rigidity.

Figures 10B, 11A:
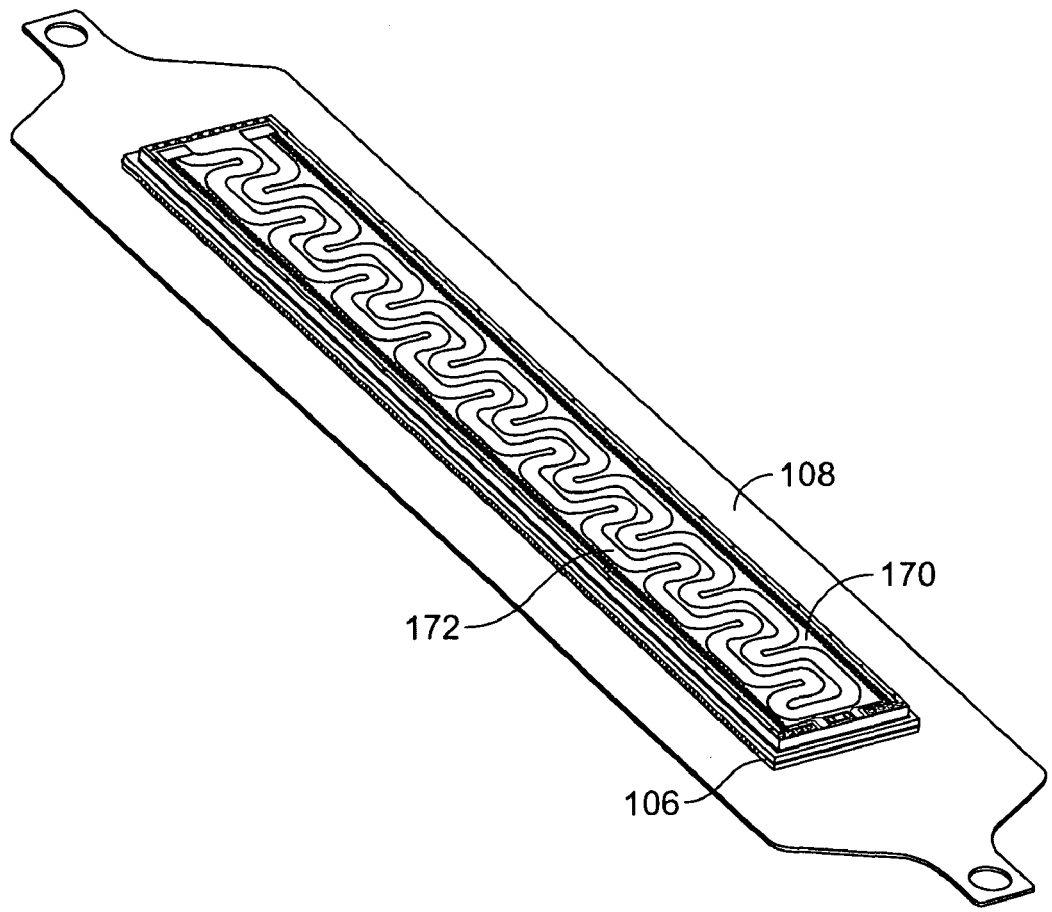
FIG. 10B shows a table with thicknesses of layers forming a flexible circuit.
FIGS. 11A and 11B show an interposer mounted on a printhead body mounted on a faceplate.

Referring to FIG. 10B, in one embodiment the layers forming the flexible circuit 100, such as the flexible circuit 100 shown in FIG. 10A, can have the thicknesses as shown. The two layer distal portion can have a thickness of 42 microns and the 7 layer central portion can have a thickness of 143 microns. A solder mask can be applied on top of the copper layer 162 and to the copper layer 166 (e.g., to connect to the printhead body 106), which can add an additional 25 microns per solder mask. The thickness can therefore be as much as 193 microns.

Including only two layers in the distal portions 144 of the flexible circuit 100 provides flexibility in the gull-wing region (i.e., the bent portion 143) to bend the flexible circuit 100 into a desired shape. Because there are less layers in the sides 100, which includes the apertures 148, alignment of the layers within the apertures 148 is facilitated.

For example, in one embodiment, the conductive material (e.g., copper) forming the leads 146 and any other electrical connections can be formed as follows. A negative of an artwork for the electrical circuit, including the leads 146, is formed on a film, for example, by a laser photo plotting technique (the "artwork negative film"). A photo-defineable film is layered over top of a sheet of copper, which is bonded to a Kapton® layer. The artwork negative film is placed over top of the copper, which is then exposed to light. A solution is then applied to the photodefinable coated copper, and the solution etches away the copper that was not exposed to the light. The photodefinable film can then be removed, and the remaining copper (i.e., copper not removed by etching) reflects the desired circuit. A second sheet of copper can be bonded to the opposite side of the Kapton, and the same process followed to form the leads 146 on the opposite side. If more than one layer of Kapton are being used, the process is repeated for each Kapton layer, which copper/Kapton layers must then be bonded together while maintaining alignment of the circuits formed in copper thereon. Precise alignment can be required to achieve connections between the layers. As such, the fewer layers to align (or no alignment at all), facilitates the fabrication.

Other materials can be used can be used to form the flexible circuit 100. For example, the metal layer can be gold and the Kapton layer can be Liquid Crystal Polymer (LCP). Additional layers can be included in either the distal portions 144 or central portion 142.

Referring to FIG. 11A, in another embodiment, an interposer 170 can be positioned between the printhead body 106 and the flexible circuit 100. The interposer 170 is attached to the upper surface of the printhead body 106. The interposer 170 can be formed, for example, from silicon. In the embodiment shown, the interposer 170 includes an optional integrated heating element 172. The heating element 172 can be formed by etching a trough into the silicon interposer 170 and filling the trough with a conductive material, such as nickel chromium. Alternatively, the heating element 172 can be formed on the opposite surface of the interposer 170.

Figure 11B:
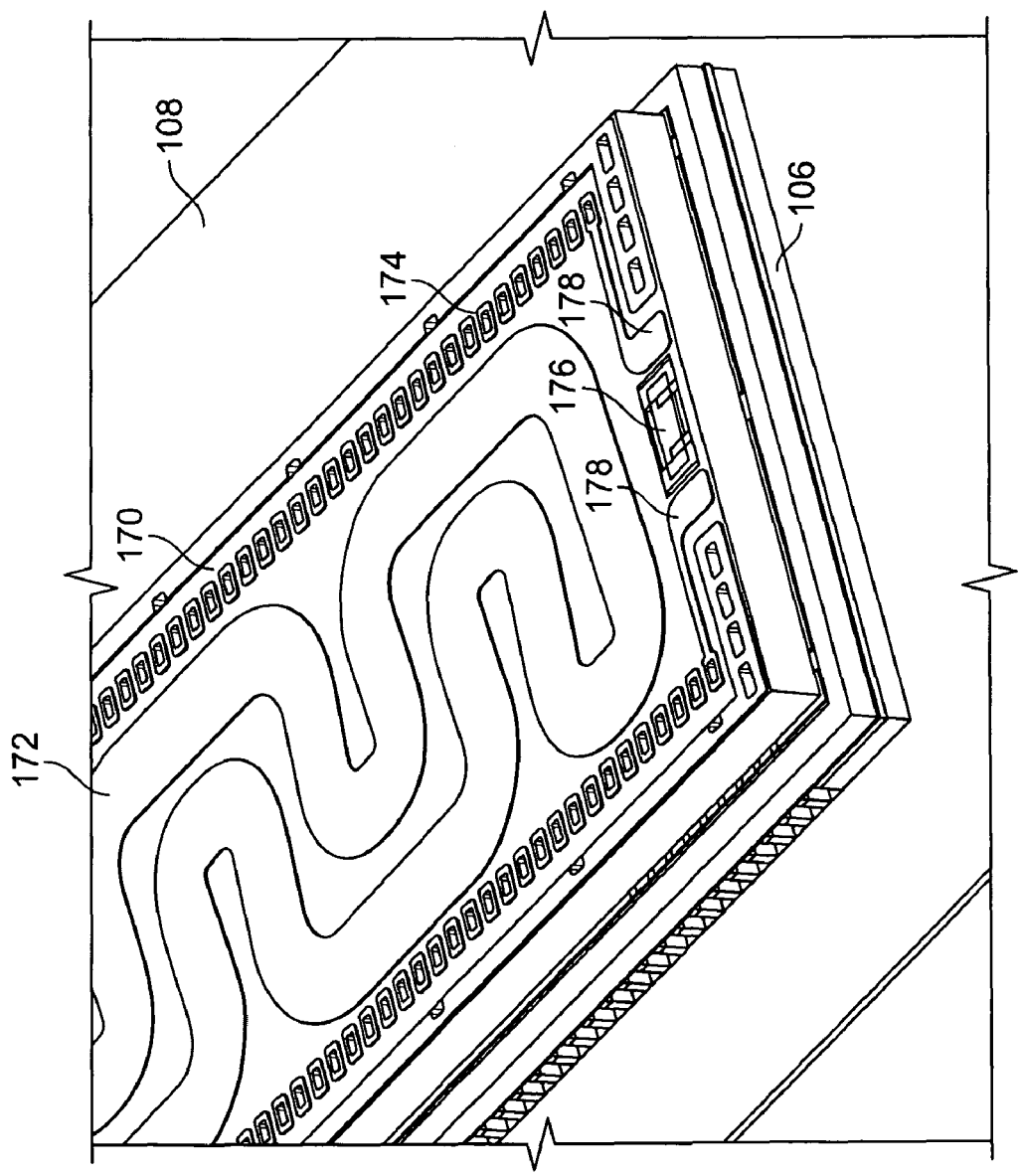

Referring to FIG. 11B, an enlarged view of a portion of the interposer 170 mounted on the printhead body 106 is shown. The interposer 170 includes apertures 174 along both sides of the interposer 170. For illustrative purposes, only a few of the apertures 174 are depicted on each side, however, similar apertures 174 are positioned along substantially the entire length of the interposer 170. The apertures 174 are coated with a conductive material, such as gold. One aperture 174 corresponds to each ink nozzle included in the ink nozzle assembly of the printhead body 106. Each metalized conductive aperture 174 provides an electrical connection to the drive contact for the corresponding actuator for the ink nozzle, such as a piezoelectric actuator configured to fire the ink nozzle. The interposer 170 can be attached to the printhead body 106 using a thin epoxy, such that when pressure and heat is applied, the gold connects through the epoxy to connectors on the printhead body 106. The epoxy can be unfilled or filled, such as a conductive particle filled epoxy. The epoxy can be a spray-on epoxy.

If the interposer 170 includes a heating element 172, as shown, then a thermistor 176 can be included on the interposer 170 to control the temperature of the heating elements, and leads 178 can provide a connection from the interposer 170 to the flexible circuit 100 to receive signals controlling the thermistor 176.

Figure 11C:
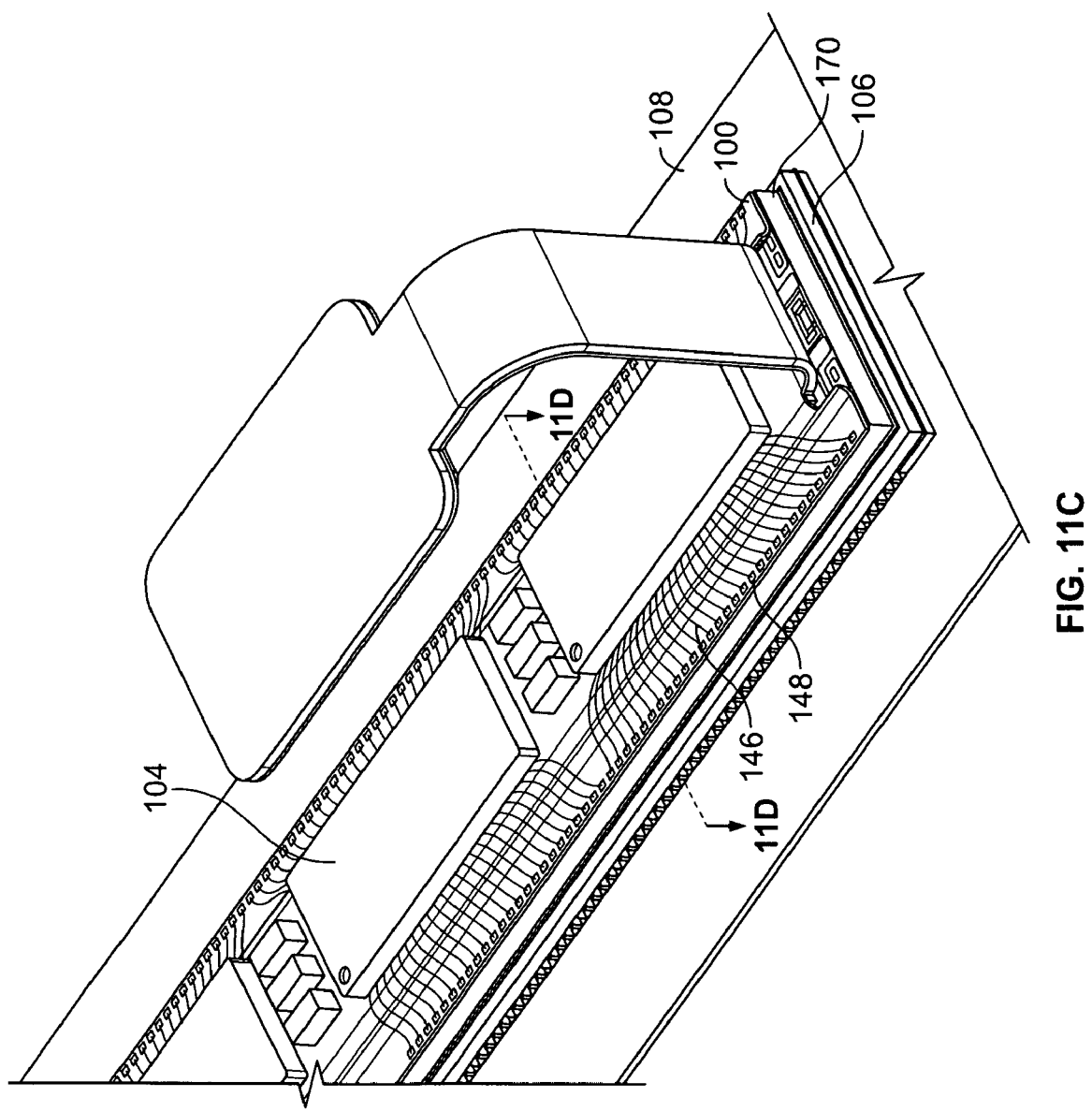
FIG. 11C shows a perspective view of a portion of a flexible circuit mounted on the printhead assembly of FIGS. 11A and 11B.

Referring to FIG. 11C, an enlarged view of a portion of the flexible circuit 100 mounted on the interposer 170, which is mounted on the printhead body 106 affixed to the faceplate 108, is shown. Each aperture 148 formed in the flexible circuit 100 is aligned with a corresponding aperture 174 formed in the interposer 170. A signal can thereby travel from an integrated circuit 104, through a flexible circuit lead 146 to a conductive aperture 148 in the flexible circuit 100, to a conductive aperture 174 in the interposer 170, and finally to an ink nozzle activator in the printhead body 106.

Figure 11D:
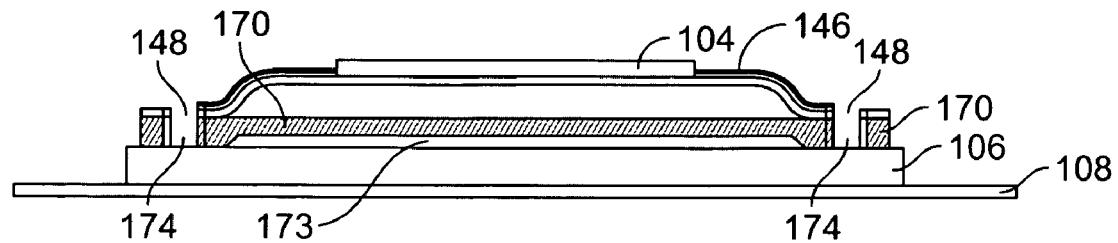
FIG. 11D shows a cross-sectional view of the printhead assembly of FIG. 11C taken along line 11D-11D.

Referring to FIG. 11D, a cross-sectional view of the assembly of FIG. 11C is shown along line 11D-11D. The flexible circuit 100 is mounted onto the interposer 170, for example, using an epoxy connection, solder connection or ACF (anisotropic conductive film). A flexible circuit lead 146 on the surface of the flexible circuit 100 connects to a conductive aperture 148 formed in a distal portion 144 of the flexible circuit 100. The aperture 148 is aligned with a conductive aperture 174 in the interposer 170. The aperture 174 in the interposer is aligned with an activator in the printhead body 106 for activating an ink nozzle. In the embodiment shown, the activator is a piezoelectric actuator including a piezoelectric material that bends in response to a voltage applied, thereby pressurizing ink in a corresponding ink chamber and causing the ejection of an ink drop from an ink nozzle. The underside of the interposer 170, i.e., the surface that connects to the printhead body 106, includes a recess 173 to provide clearance for the piezoelectric material included on the top surface of the printhead body 106.

In another embodiment, the flexible circuit 100 can be substantially flat, that is the central portion 142 and distal portions 144 can all be flush with the top surface of the interposer 170. This can be an advantage, since it can eliminate the fabrication step of forming bends in the flexible circuit 100.

There are a number of advantages to including an interposer 170 between the flexible circuit 100 and the printhead body 106. The flexible circuit 100 can be connected to the interposer 170 before attaching the interposer 170 to the printhead body 106. This allows connections of the flexible circuit 100 and between the flexible circuit 100 and the interposer 170 to be tested before the flexible circuit 100/interposer 170 assembly is attached to the printhead body 106. If there is a problem with the connections, the flexible circuit 100 can be replaced, without having to replace the printhead body 106 or attempt to remove the flexible circuit 100 from the printhead body 106 without damaging the printhead body 106. The likelihood of damaging the printhead body 106 during the assembly process is reduced by attaching the flexible circuit 100 to the interposer 170 rather than directly to the printhead body 106. The surfaces of the interposer 170 and the printhead body 106 that will be in contact with one another can be polished to provide a precise match. This can reduce or eliminate pressure variations along the length of the printhead body 106 that can occur when attaching the circuit directly to the printhead body 106 by soldering. Optionally, as described above, the interposer 170 can include a heating element 172.

Figure 12:
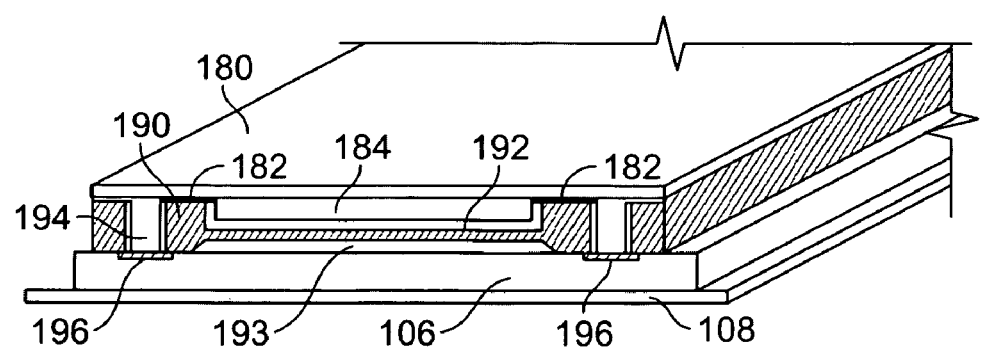
FIG. 12 shows a cross-sectional and perspective view of a flexible circuit mounted on an interposer that is mounted on a printhead body that is mounted on a faceplate.

Referring to FIG. 12, a cross-sectional perspective view of another embodiment of a flexible circuit 180 is shown. In this embodiment, the integrated circuits 184 are mounted onto the same surface of the flexible circuit 180 that is attached to an interposer 190. The interposer 190 includes a recess 192 that is configured to accommodate the integrated circuit 184 suspended from the flexible circuit 180. The interposer 190 can include one recess 192 that extends the length of the interposer 190, or multiple recesses 192 positioned to correspond to the positions of the multiple integrated circuits 184 mounted on the circuit. On the opposite side, the interposer 190 includes a recess 193 to provide clearance for the piezoelectric material included in the printhead body 106. In this embodiment, the leads 182 from the integrated circuits 184 are on the same surface that is attached to the interposer 190, and accordingly apertures, such as the apertures 148 in the flexible circuit 100 described above, are not required. Rather, the leads 182 can extend to contact directly the corresponding conductive apertures 194 formed in the interposer 190, similar to the conductive apertures 174 described above in reference to the interposer 170 shown in FIGS. 11A-D. The conductive apertures 194 are in contact with the drive contacts 196 for the actuators for corresponding ink nozzles located in the printhead body 106, such as piezoelectric actuators.

An advantage of the embodiment of the flexible circuit 180 shown in FIG. 12 is the elimination of apertures to connect the leads 182 to the interposer 190. The flexible circuit 180 can be formed substantially flat, as shown, thereby also eliminating the need to shape the flexible circuit 180, for example, to form bends as in the embodiment shown in FIG. 1. The flexible circuit 180 can be formed from layers of polyimide coated with copper, as described above in reference to FIG. 10. However, because the flexible circuit 180 is substantially flat and does not require apertures, in one embodiment, the flexible circuit 180 can include two layers of polyimide and four layers of copper throughout, rather than having thinner sides as in the embodiment depicted in FIG. 10. Other materials and numbers of layers can be used, as described above in reference to the flexible circuit 100.

The use of terminology such as "upper" and "lower" and "top" and "bottom" throughout the specification and claims is for illustrative purposes only, to distinguish between various components of the flexible printhead circuit and other elements described herein. The use of "upper" and "lower" and "top" and "bottom" does not imply a particular orientation of the flexible printhead circuit. For example, the upper surface of the interposer described herein can be orientated above, below or beside a lower surface, and visa versa, depending on whether the interposer is positioned horizontally face-up, horizontally face-down or vertically.

Although only a few embodiments have been described in detail above, other modifications are possible. Other embodiments may be within the scope of the following claims.

What is claimed is:

1. A system to connect a printhead body to an external circuit, the system comprising:
   a circuit configured to connect to an interposer, the circuit comprising:
      a substantially planar portion having a length and a width and including one or more layers of conductive material;
      a plurality of integrated circuits mounted onto the planar portion along the length of the planar portion;
      a plurality of leads extending from each integrated circuit, the plurality of leads configured to electrically connect to the printhead body; and
      one or more arms attached to the planar portion along the width of the planar portion, each arm including one or more external connectors configured to connect to the external circuit; and
   an interposer comprising:
      an upper surface configured to connect to the circuit along the length of the planar portion;
      a lower surface configured to connect to the printhead body; and
      wherein the interposer is configured to provide an electrical connection between the circuit and the printhead body and is positioned between the circuit and the printhead body along the length of the planar portion of the circuit.

2. The system of claim 1, where the substantially planar portion of the circuit includes at least one layer of copper and at least one layer of polyimide.

3. The system of claim 1, where each arm includes a distal end that is substantially parallel to a top surface of the planar portion, the distal end including one or more contacts to connect to the external circuit.

4. The system of claim 1, where the substantially planar portion of the circuit further comprises:
   a first layer of polyimide coated on either side with layers of copper;
   a second layer of polyimide coated on either side with layers of copper; and
   a layer of adhesive joining the first layer to the second layer.

5. The system of claim 1, the interposer further including a heating element.

6. The system of claim 1, the planar portion further comprising:
   a central portion; and
   two distal portions on either side of the central portion;
   where the two distal portions are attached to the upper surface of the interposer and the central portion is raised from the upper surface of the interposer relative to the two distal portions.

7. The system of claim 6, wherein:
   the central portion is comprised of a first layer of polyimide coated on either side with layers of copper, a second layer of polyimide coated on either side with layers of copper, and a layer of adhesive joining the first layer to the second layer; and
   each distal portion is comprised of a layer of polyimide coated with a layer of copper.

8. The system of claim 1, wherein:
   the substantially planar portion has a top surface substantially parallel to a top surface of the printhead body; and the one or more arms are substantially perpendicular to the planar portion.

9. The system of claim 1, wherein the interposer further includes a plurality of interposer apertures, each interposer aperture coated with a conductive material and in electrical communication with a corresponding one of the plurality of leads extending from each integrated circuit.

10. The system of claim 9, the circuit further comprising:
a plurality of circuit apertures, each circuit aperture coated with a conductive material and providing an electrical connection to a corresponding interposer aperture; and
where each of the plurality of leads extends from an integrated circuit to connect to one of the plurality of circuit apertures, such that each of the plurality of leads is in electrical communication with a corresponding one of the plurality of interposer apertures.

11. The system of claim 9, where the plurality of integrated circuits are mounted on a bottom surface of the substantially planar portion of the circuit, the interposer further comprising:
one or more recesses formed in the upper surface, the one or more recesses configured to receive the plurality of integrated circuits mounted on the bottom surface of the substantially planar portion of the circuit; and
where each of the plurality of leads extends from one of the plurality of integrated circuits to connect to one of the plurality of interposer apertures, such that each of the plurality of leads is in electrical communication with a corresponding one of the plurality of interposer apertures.

12. A system to connect a printhead body to an external circuit, the system comprising:
a circuit configured to connect to an interposer, the circuit comprising:
a substantially planar portion having a length and a width including one or more layers of conductive material;
a plurality of integrated circuits mounted onto a bottom surface along the length of the planar portion;
a plurality of leads extending from each integrated circuit, the plurality of leads electrically connected to the printhead body by way of a plurality of interposer apertures; and
one or more arms attached to the planar portion along the width of the planar portion, each arm including one or more external connectors configured to connect to the external circuit; and
an interposer comprising:
an upper surface configured to connect to the circuit along the length of the planar portion, the upper surface including one or more recesses configured to receive the plurality of integrated circuits mounted on the bottom surface of the substantially planar portion of the circuit;
a lower surface configured to connect to the printhead body; and
wherein the interposer is configured to provide an electrical connection between the circuit and the printhead body and is positioned between the circuit and the printhead body along the length of the planar portion of the circuit.

13. The system of claim 12, the interposer further including a heating element.

14. The system of claim 12, wherein:
the substantially planar portion has a top surface substantially parallel to a top surface of the printhead body; and
the one or more arms are substantially perpendicular to the planar portion.

15. The system of claim 12, wherein the interposer further includes the plurality of interposer apertures, each interposer aperture coated with a conductive material and in electrical communication with a corresponding one of the plurality of leads extending from each integrated circuit.

16. A system comprising:
a circuit configured to connect to an external circuit and to an interposer; and
the interposer having a length and comprising:
an upper surface configured to connect to the circuit along the length of the interposer;
a lower surface configured to connect to a printhead body; and
wherein the interposer is configured to provide an electrical connection between the circuit and the printhead body and is positioned between the circuit and the printhead body along the length of the interposer; and
an integrated heating element formed integrally in the interposer and extending along the length of the interposer and positioned between the circuit and the printhead body.

17. The system of claim 16, the interposer further comprising:
a plurality of interposer apertures, each interposer aperture coated with a conductive material.

18. The system of claim 16, where:
the interposer comprises silicon and the integrated heating element comprises a trough formed in the silicon and filled with a conductive material.

19. The system of claim 16, where the interposer further comprises a thermistor configured to control a temperature of the integrated heating element, the thermistor electrically connected to the circuit and operable to receive signals from the circuit controlling the thermistor.

20. The system of claim 16, where:
the interposer further comprises a plurality of interposer apertures, each interposer aperture coated with a conductive material; and
the circuit comprises:
a substantially planar portion including one or more layers of conductive material and having a top surface substantially parallel to a top surface of the printhead body;
one or more integrated circuits mounted onto the planar portion;
a plurality of leads extending from each integrated circuit, where each of the plurality of leads is in electrical communication with a corresponding one of the plurality of interposer apertures to electrically connect the circuit to the printhead body; and
one or more arms attached to, and substantially perpendicular to, the planar portion, each arm including one or more external connectors configured to connect to the external circuit.

21. The system of claim 20, where the substantially planar portion of the circuit further comprises:
a first layer of polyimide coated on either side with layers of copper;
a second layer of polyimide coated on either side with layers of copper; and
a layer of adhesive joining the first layer to the second layer.

22. The system of claim 20, the substantially planar portion further comprising:
a central portion; and two distal portions on either side of the central portion;

where the two distal portions are attached to the upper surface of the interposer and the central portion is raised from the upper surface of the interposer relative to the two distal portions.

23. The system of claim 20, the circuit further comprising:

a plurality of circuit apertures, each circuit aperture coated with a conductive material and providing an electrical connection to a corresponding interposer aperture; and where each of the plurality of leads extends from an integrated circuit to connect to one of the plurality of circuit apertures, such that each of the plurality of leads is in electrical communication with a corresponding one of the plurality of interposer apertures.

24. The system of claim 16, where the circuit is formed substantially flat and in a single plane.

25. The system of claim 16, where the integrated heating element is formed in the upper surface of the interposer.

* * * * *